United States Patent [19]

Whiteside

[11] Patent Number: 5,686,863

[45] Date of Patent: Nov. 11, 1997

[54] TUNABLE TONE CONTROL CIRCUIT AND A DEVICE AND METHOD FOR TUNING THE RC CONSTANTS

[75] Inventor: Frank A. Whiteside, Coppell, Tex.

[73] Assignee: Dallas Semiconductor Corp., Dallas, Tex.

[21] Appl. No.: 536,897

[22] Filed: Sep. 29, 1995

[51] Int. Cl.[6] ............................ H03F 3/45; H03F 1/34
[52] U.S. Cl. .................... 330/260; 330/304; 330/305; 381/101
[58] Field of Search ............................ 330/260, 304, 330/305, 254, 282, 284; 333/28 R; 381/101, 102, 103; 327/103, 124

[56] References Cited

U.S. PATENT DOCUMENTS

| | | | |
|---|---|---|---|
| 3,444,474 | 5/1969 | Borenstein et al. | 330/304 |
| 3,714,603 | 1/1973 | Williford | 330/109 |
| 4,458,212 | 7/1984 | Brehmer et al. | |
| 4,634,986 | 1/1987 | Brookshier. | |
| 5,079,514 | 1/1992 | Mijuskovic. | |
| 5,198,700 | 3/1993 | Whiteside. | |
| 5,406,220 | 4/1995 | Jones, III et al. | |
| 5,444,579 | 8/1995 | Klein et al. | 330/305 X |

OTHER PUBLICATIONS

M. Ismail, et al. "A New MOSFET–C Universal Filter Structure for VLSI", IEEE Journal of Solid–State Circuits, vol. 23, No. 1, Feb. 1988, pp. 183–194.

A. Abidi, "Linearization of Voltage–Controlled Oscillators Using Switched–Capacitor Feedback", IEEE Journal of Solid–State Circuits, vol. SC–22, No. 3, Jun. 1987, pp. 494–496.

M. H. Wakayama, et al., "A 30MHz Voltage–Controlled Oscillator with 0.17% Linearity", IEEE International Solid–State Circuits Conference, 1987, pp. 220–221.

Y. Tsividis, et al. "Continuous–Time MOSFET–C Filters in VLSI", IEEE Journal of Solid–State Circuits, vol. SC–21, No. 1, Feb. 1986, pp. 15–30.

D. Inami, et al. "An Adaptive Line Equalizer LSI for ISDN Subscriber Loops", IEEE Journal of Solid–State Circuits, vol. 23, No. 3, Jun. 1988, pp. 657–663.

M. Ishikawa, et al. "A CMOS Adaptive Line Equalizer", IEEE Journal of Solid–State Circuits, vol. SC–19, No. 5, Oct. 1984, pp. 788–793.

H. Takatori, et al. "Low–Power Line Equalizer for Digital Subscriber Loop" 1984 IEEE, 1984 IEEE, Section 1.6.1–1.6.6, pp. 26–31.

T. Suzuki et al. "A CMOS Switched–Capacitor Variable Line Equalizer" IEEE Journal of Solid–State Circuits, vol. SC–18, No. 6, Dec. 1983, pp. 700–705.

C. Rahim et al. "A High Performance Custom Standard Cell CMOS Equalizer for Telecommunications Applications" IEEE 1986 Custom Integrated Circuits Conference, pp. 391–394.

Primary Examiner—James B. Mullins
Attorney, Agent, or Firm—Jenkens & Gilchrist

[57] ABSTRACT

An equalizer, for providing a tunable pole/zero compensated output signal, includes a integrated tone control circuit with a MOSFET-C configuration such that the spacing between the pole and the zero and the center frequency of the pole/zero pair can be tuned by varying the resistance of MOSFET resistors using variable voltage sources applied to the gates of the MOSFETs.

12 Claims, 2 Drawing Sheets

TUNABLE TONE CONTROL CIRCUIT AND A DEVICE AND METHOD FOR TUNING THE RC CONSTANTS

PARTIAL WAIVER OF COPYRIGHT PROTECTION

A portion of the disclosure of this patent document contains material which is subject to copyright protection. The copyright owner has no objection to the facsimile reproduction by any one of the patent disclosure, as it appears in the United States Patent and Trademark office patent files or records, but otherwise reserves all copyright rights whatsoever.

FIELD OF THE INVENTION

This invention relates to equalizer circuits, and more particularly, to an integrated tone control circuit providing tunable pole/zero compensation.

CROSS REFERENCE TO RELATED APPLICATIONS

This application is related to the following U.S. patent applications:

| SERIAL NO. | TITLE | INVENTOR(S) |
| --- | --- | --- |
| 08/537,214 | Differential Cross Coupled Peak Detector | Smith |
| 08/536,895 | Amplifier with Pole/Zero Compensation | Whiteside |
| 08/536,023 | Over Sampled State Machine for Jitter Tolerant Pulse Detection | Smith et al. |
| 08/536,875 | Ones Density Monitor | Smith |
| 08/536,906 | Sample Point Adjustment | Smith et al. |

All of the related applications are filed on even date herewith, are assigned to the assignee of the present invention, and are hereby incorporated herein in their entirety by this reference thereto.

BACKGROUND OF THE INVENTION

In a standard tone control or equalizer circuit using pole/zero pair compensation, it is the spacing of the pole and zero with respect to each other that determines the amount of gain or attenuation provided by the circuit at any given frequency.

Some existing integrated tone control circuits utilize potentiometers or variable resistors to vary the positions of the pole or the zero. One such type uses an external potentiometer and another uses an integrated variable resistor on a chip with discreet series of taps instead of a pot with a wiper. The integrated variable resistors normally have a string of resistors with the ability to tap off any point between any two resistors. A problem with tone control circuits utilizing external potentiometers is that the overall size of the device is too large for many applications. A problem with the tone control circuits utilizing integrated variable resistors is that the resistance is not continuously variable and requires multiple selection switches.

Other types of integrated filters uses a MOSFET-C configuration, utilizing MOSFET resistors rather than potentiometers or integrated variable resistors. However, these are not suitable as tone controls because they do not generate both a pole and a zero whose frequency spacing can be varied. To overcome this shortcoming would require two separate filter stages, one to produce a pole and the other to produce a zero.

The current integrated circuits with MOSFET-C configurations also present additional problems. One problem with this configuration is that the components of the integrated circuits have a wide manufacturing tolerances. In particular resistors and capacitors can vary by ±20% from the manufacturing of one lot to the next.

Therefore, when using resistors and capacitors on an integrated circuit to build an equalizer, the center frequency of the filter can vary by ±40%. Such large fluctuations is not acceptable for most applications. This creates the additional need to be able to tune the center frequency of the equalizer.

Another problem with the current integrated circuits with MOSFET-C configurations occurs when trying to obtain unity gain at all frequencies. In order to achieve unity gain at all frequencies, the pole and the zero must occur on top of each other. However, with current configurations, to achieve unity gain the resistor value of the MOSFET must be taken to zero resistance, requiring the gate voltage to be taken to infinity, which can not be accomplished.

Yet another problem with some of the MOSFET-C configurations is that they are not linear, i.e. they distort the wave form. Further, when there is no gain at high frequencies, the resistant values of the MOSFET resistor is required to approach infinity, meaning that the MOSFET resistor would have to be turned off completely which creates additional distortion.

As discussed above, because of the wide manufacturing tolerances of components on integrated circuits, such as resistors and capacitors, the RC values of an equalizers must be tunable to be able to readily generate a required RC constant for the center frequency.

Previous methods utilized in tuning a MOSFET-C configuration generally involved phase locked loops (PLL) circuits. A typical PLL includes two cascade integrators with the output of one fed back to the input of the other with an inversion, making an oscillator.

The frequency of the MOSFET-C oscillator is then compared to a reference frequency generated from either a crystal oscillator or a system clock. If one frequency is faster than the other, a correction signal is generated to vary the resistance values of the MOSFET resistors via their gate voltage and the frequency of the oscillator would be adjusted until it matched the frequency of the reference frequency.

This is a type of phase locked loop where the voltage-controlled oscillator is a MOSFET C structure, and when the oscillator is tuned to the correct frequency, the resistors and capacitors generate poles or zeros of a known value.

A problem with the PLL is that it is very complex, it requires substantial amounts of hardware, and when a wide band amplifier is used, the oscillator needed for the PLL requires two or more amplifiers are needed, which utilizes a lot of power.

Another method is used for less demanding applications that is much cruder than the PLL. A separate resistor and an variable voltage source is applied to the gate of a MOSFET. The voltage is varied until the resistance of that MOSFET matches the separate resistor. This method has the disadvantage that it does not account for any fluctuations in the values of the capacitors in the tone control circuit, which can vary 15–20%.

SUMMARY OF THE INVENTION

The present invention overcomes the above identified problems by providing a tone control circuit with tunable pole/zero compensation and a device and method for tuning the RC constant.

Accordingly, it is an object of the present invention to provide a tone control circuit with tunable pole/zero compensation.

It is a further object of the present invention to provide a tone control circuit for providing tunable pole/zero compensation, where the spacing of the distance between the pole and the zero can be varied.

It is yet another object of the present invention to provide a tone control circuit for providing tunable pole/zero compensation, where the center frequency of the pole/zero pair can be varied.

It is another object of the present invention to provide a tunable control circuit that is substantially linear in operation and is easily integrated.

It is still another object of the present invention to provide tunable control circuit that can be tuned to readily and repeatedly generate unity gain.

It another object of the present invention to provide a simple, low power device for tuning the control circuit.

In accordance with the above and other objects there is provided an integrated tone control circuit utilizing a MOSFET-C configuration for generating a tunable pole/zero compensated output with the spacing of the pole and the zero with respect to each other being tunable as well as the center frequency of the pole/zero pair. There is further provided a low power method and device for tuning the RC constants of the integrated tone control circuit.

BRIEF DESCRIPTION OF THE DRAWINGS

A more complete understanding of the present invention may be had by reference to the following Detailed Description when taken in conjunction with the accompanying Drawings wherein.

DETAILED DESCRIPTION OF THE PRESENTLY PREFERRED EXEMPLARY EMBODIMENTS

Figure 1:
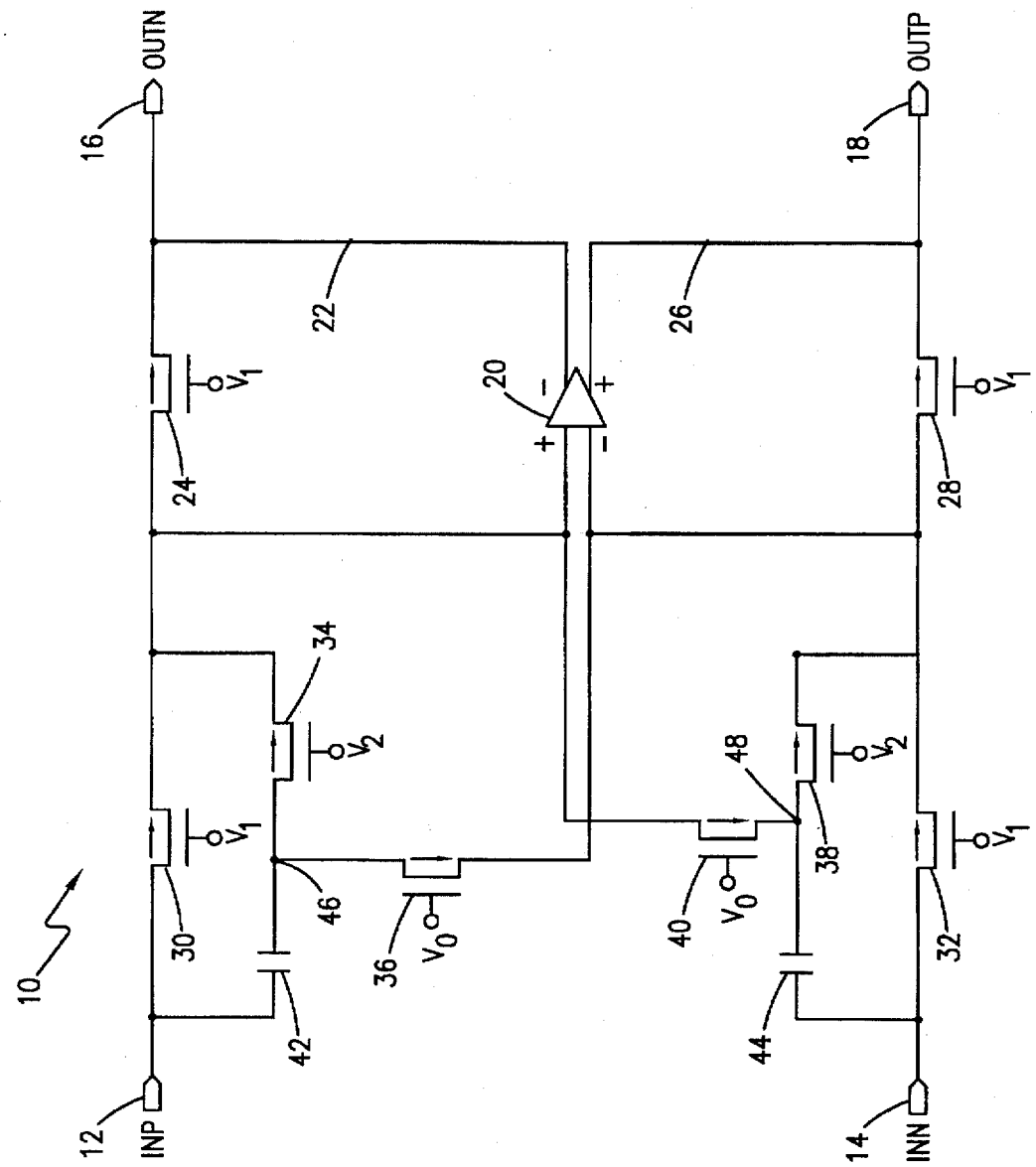
FIG. 1 is a schematic diagram illustrating an tone control circuit with tunable pole/zero compensation in accordance with the present invention.

Referring to FIG. 1, there is shown an integrated tunable tone control circuit 10 of a preferred embodiment of the present invention.

Tunable tone control circuit 10 includes inputs 12 and 14, and outputs 16 and 18. Additionally, tunable tone control circuit 10 includes a differential operational amplifier 20 which is provided with positive and negative input terminals and positive and negative output terminals. A differential amplifier is used to maintain stability and avoid non-linearity problems in the circuit.

A first feedback loop 22 is coupled between the negative output and the positive input of differential operational amplifier 20 and includes a resistive element or MOSFET resistor 24.

A second feedback loop 26 is coupled between the positive output and the negative input of differential operational amplifier 20 and includes a resistive element or MOSFET resistor 28. The gates of MOSFET resistors 24 and 28 are each coupled to a first variable voltage source $V_1$. The pole of the pole/zero pair generated by tunable control circuit 10 is generated by MOSFET resistors 24 and 28 of feedback loops 22 and 26.

A MOSFET resistor 30 is coupled between input 12 and the positive input terminal of differential operational amplifier 20. MOSFET resistor 32 is coupled between input 14 and the negative input terminal of differential operational amplifier 20. The gates of MOSFET resistors 30 and 32 are also coupled to variable voltage source $V_1$.

Tunable control circuit 10 also includes MOSFET resistors 34, 36, 38 and 40, and capacitors 42 and 44. MOSFET resistor 34 and capacitor 42 are coupled in series with one another with a node 46 therebetween, and are coupled in parallel with MOSFET resistor 30. MOSFET resistor 36 is coupled between node 46 and the negative input terminal of differential operational amplifier 20.

MOSFET resistor 38 and capacitor 44 are also coupled in series with one another with node 48 therebetween, and are coupled in parallel with MOSFET resistor 32. MOSFET resistor 40 is coupled between node 48 and the positive input terminal of differential operational amplifier 20.

The gates of MOSFET resistors 34 and 38 are coupled to a second variable voltage source $V_2$, and the gates of MOSFET resistors 36 and 40 coupled to a third variable voltage source $V_0$. The zero of the pole/zero pair generated by tunable control circuit 10 is generated by MOSFET resistors 34, 36, 38 and 40, and capacitors 42 and 44.

The spacing between the pole and the zero is determined by the resistance of MOSFET resistors 34 and 38. The resistance across MOSFET resistors 34 and 38 can be varied to adjust the separation of the pole and the zero. This is accomplished by varying the voltage of variable voltage source $V_2$ across the gates of MOSFET resistors 34 and 38.

It is understood and contemplated to be within the scope of this invention that MOSFET resistors 24 and 28 can each be shunted by capacitors to add additional fixed-frequency poles if desired.

It is the RC constant of tunable control circuit 10 that establishes the center frequency of the pole/zero pair. The RC constant is determined by the resistance values of MOSFET resistors 30, 32, 36 and 40, and the capacitance values of capacitors 42 and 44. Because the capacitance of capacitors 42 and 44 is fixed, the center frequency of the pole/zero pair can be varied or tuned by varying the resistance values of MOSFETs 30, 32, 36 and 40. The resistance values of MOSFETS 30, 32, 36 and 40 are varied by varying the voltages of variable voltage sources $V_1$ and $V_2$, accordingly, across the gates of the MOSFET resistor.

Figure 2:
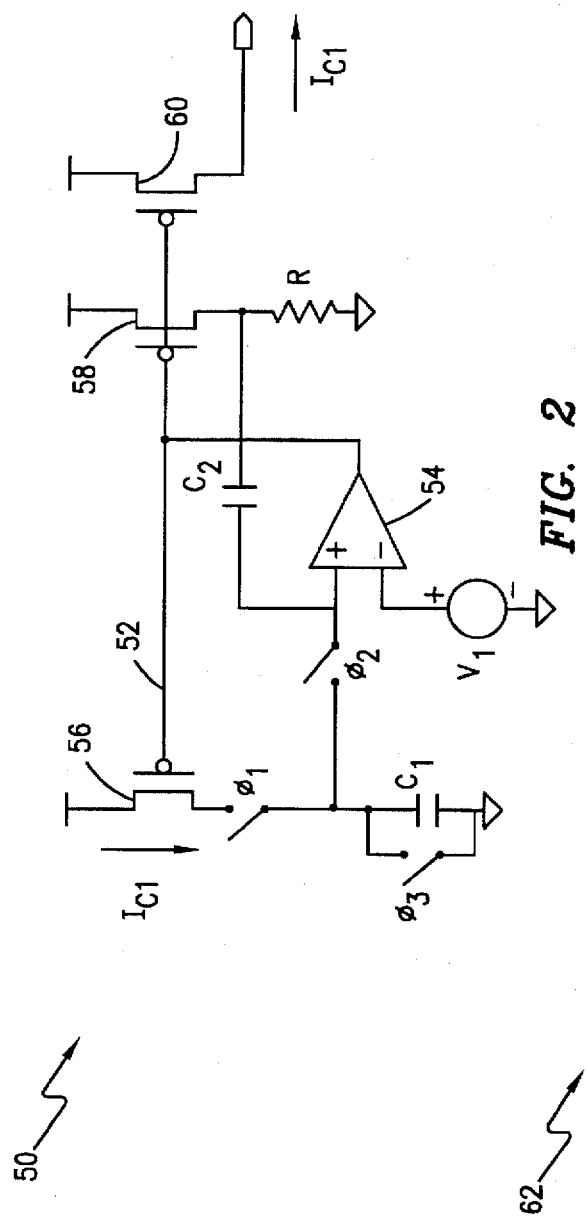
FIG. 2 is a schematic diagram illustrating a circuit to generate a current proportional to a capacitor.
Figure 3:
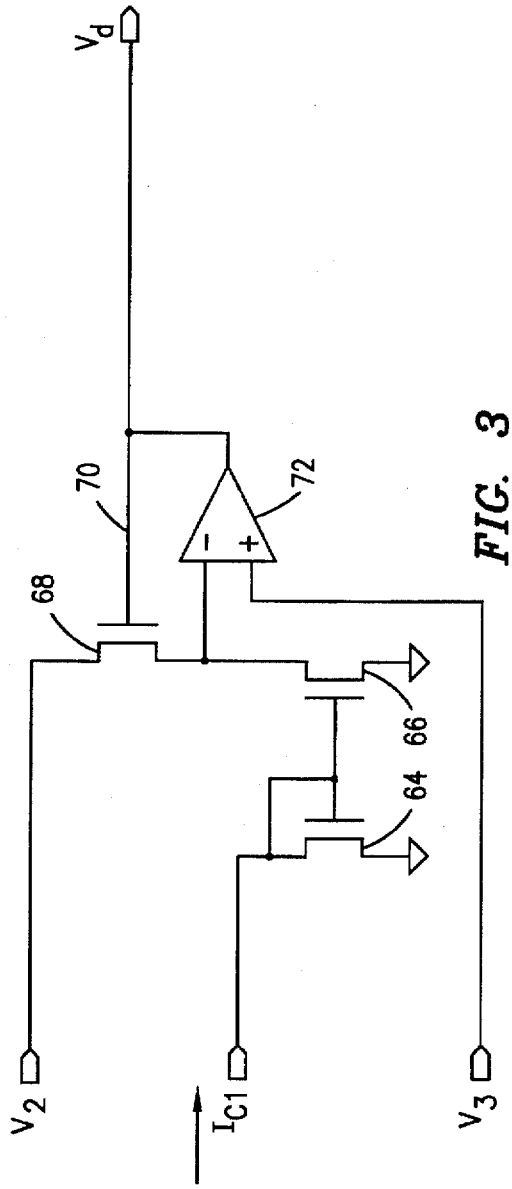
FIG. 3 is a schematic diagram illustrating a circuit to generate a control voltage.

Referring now to FIGS. 2 and 3, there is shown a preferred embodiment of the present invention for tuning the RC constants of the circuit shown in FIG. 1.

Referring first to FIG. 2, there is shown a circuit 50 for the generation of a current proportional to a known capacitance of a capacitor $C_1$. Switches $\phi_1$, $\phi_2$ and $\phi_3$ are used to direct a current into capacitor $C_1$ for a predetermined amount of time. At the end of the predetermined time, the voltage on capacitor $C_1$ is measured by closing switch $\phi_2$. After the measurement is made, switch $\phi_2$ is open and switch $\phi_3$ is closed to discharge capacitor $C_1$ resetting it for another measurement. The feedback loop 52 through operational amplifier 54 adjusts the current until a current is generated that will charge the capacitance of $C_1$ through a known voltage $V_1$, in the predetermined amount of time. When this current has been determined the current, illustrated as $I_{C_1}$, will be proportional to the capacitance of $C_1$. MOSFETs 56, 58 and 60 across the top of circuit 50 are current mirrors, with MOSFET 60 being the output for generating the current that is equal to $I_{C1}$.

Referring now to FIG. 3, there is shown a circuit 62 for the generation of the control voltage $V_d$ from $I_{C1}$, to be applied to MOSFET resistors 30, 32, 36 and 40 of tunable control circuit 10 (FIG. 1). Circuit 62 receives current $I_{C1}$ and forces it through a MOSFET resistors 64 and 66. MOSFET resistor 66 pulls a new current through MOSFET resistor 68. MOSFET 68 is a typical MOSFET resistor and is made with identical parameters to the MOSFET resistors of tunable control circuit 10. The feed back loop 70 of operational amplifier 72 varies the voltage on the gate of MOSFET resistor 68 until the voltage drop, $V_d$, cause by this current is equal to a known reference voltage, which is $V_2$ minus $V_3$. Both $V_2$ and $V_3$ are derived from a band gap reference.

Circuits 50 and 62 ultimately vary the value of the MOSFET resistors of the tunable control circuit 10 and compensate for the manufacturing process variations in them and also compensates for the process variations in the capacitors of the tunable control circuit 10 to produce a constant RC product.

CONCLUSION

Although a preferred embodiment of the present invention has been illustrated in the accompanying Drawings and described in the foregoing Detailed Description, it will be understood that the invention is not limited to the embodiment disclosed, but is capable of numerous rearrangements, modifications and substitutions without departing from the spirit of the invention as set forth and defined by the following claims.

What is claimed is:

1. An integrated tunable control circuit for producing a compensated output characterized by a pole/zero pair, said circuit comprising:

a. a positive input, a negative input, a positive output and a negative output;

b. a differential operational amplifier including a positive input electrically connected to said negative input of the circuit, a negative input electrically connected to said positive input of the circuit, a positive output electrically connected to said positive output of the circuit, and a negative output electrically connected to said negative output of the circuit;

c. means for generating a pole/zero pair, said pole/zero pair including a pole and a zero, said generating means including a first resistive element coupled between said negative output of said differential operational amplifier and said positive input of said differential operational amplifier and a second resistive element coupled between said positive output of said differential operational amplifier and said negative input of said differential operational amplifier;

d. means for positioning said pole/zero pair about a selected frequency; and e. separation means for varying the spacing of said pole and said zero from the selected frequency.

2. A circuit as recited in claim 1, wherein:

a. each of said first and second resistive elements include a MOSFET resistor.

3. A circuit as recited in claim 1, wherein said means for positioning said pole/zero pair about a selected frequency includes:

a. a third resistive element and a first capacitor coupled between said positive input of the circuit and said negative input of said differential operational amplifier;

b. said third resistive element coupled in series with said first capacitor having a first node therebetween; and c. a fourth resistive element coupled between said positive input of the circuit and said positive input of said differential operational amplifier;

d. wherein the selected frequency of the pole/zero pair corresponds to the resistance values of said third and fourth resistive elements and the capacitance value of said first capacitor.

4. A circuit as recited in claim 3, wherein:

a. each of said third and fourth resistive elements includes a MOSFET resistor each having a gate.

5. A device as recited in claim 4, wherein said means for positioning said pole/zero pair about a selected frequency includes:

a. a fifth resistive element and a second capacitor coupled between said negative input of the circuit and said positive input of said differential operational amplifier;

b. said fifth resistive element coupled in series with said second capacitor having a second node therebetween; and c. a sixth resistive element coupled between said negative input of the circuit and said negative input of said differential operational amplifier;

d. wherein the selected frequency of the pole/zero pair corresponds to the resistance values of said fifth and sixth resistive elements and the capacitance value of said second capacitor.

6. A circuit as recited in claim 5, wherein:

a. each of said fifth and sixth resistive elements includes a MOSFET resistor each having a gate.

7. A circuit as recited in claim 6, wherein said means for positioning said pole/zero pair at a selected frequency includes:

a. variable voltage sources connected to each of said gates of said MOSFET resistors of said third, fourth, fifth and sixth resistive elements; and b. wherein the resistance value of each said MOSFET resistor of said third, fourth, fifth and sixth resistive elements can be varied to change the selected frequency of the pole/zero pair by varying said variable voltage sources.

8. A circuit as recited in claim 7, wherein said means for varying the spacing of said pole and said zero from the selected frequency includes:

a. a seventh resistive element coupled between said first node and said positive input of said differential operational amplifier; and b. wherein the spacing of each of said pole and zero corresponds to the resistance value of said seventh resistive element.

9. A circuit as recited in claim 8, wherein:

a. said seventh resistive element includes a MOSFET resistor having a gate.

10. A circuit as recited in claim 9, wherein said means for varying the spacing of said pole and said zero from the selected frequency includes:

a. an eighth resistive element coupled between said second node and said negative input of said differential operational amplifier; and b. wherein the spacing of each of said pole and zero corresponds to the resistance value of said eighth resistive element.

11. A circuit as recited in claim 10, wherein:

a. said eighth resistive element includes a MOSFET resistor having a gate.

12. A circuit as recited in claim 11, wherein said means for varying the spacing of said pole and said zero from the selected frequency includes:

a. variable voltage sources connected to each of said gates of each of said MOSFET resistors of said seventh and eighth resistive elements; and b. wherein the resistance value of each of said MOSFET resistors of said seventh and eighth resistive elements can be varied to change the spacing of said pole and said zero from the selected frequency.

* * * * *